United States Patent
Fischer et al.

(10) Patent No.: US 8,603,908 B2
(45) Date of Patent: Dec. 10, 2013

(54) MITIGATION OF SILICIDE FORMATION ON WAFER BEVEL

(75) Inventors: Andreas Fischer, Castro Valley, CA (US); William Scott Bass, Wachau (DE)

(73) Assignee: Lam Research Corporation, Fremont, CA (US)

( * ) Notice: Subject to any disclaimer, the term of this patent is extended or adjusted under 35 U.S.C. 154(b) by 183 days.

(21) Appl. No.: 13/102,923

(22) Filed: May 6, 2011

(65) Prior Publication Data

US 2012/0282766 A1  Nov. 8, 2012

(51) Int. Cl.
*H01L 21/44*  (2006.01)
*H01L 21/31*  (2006.01)
*H01L 21/469*  (2006.01)
*H01L 21/66*  (2006.01)

(52) U.S. Cl.
USPC ..... 438/597; 438/788; 438/656; 257/E21.529

(58) Field of Classification Search
USPC .......... 438/149, 585, 597, 763; 257/E21.228, 257/E21.241, E21.251, E21.324, E21.347
See application file for complete search history.

(56) References Cited

U.S. PATENT DOCUMENTS

| | | | | |
|---|---|---|---|---|
| 5,620,920 | A * | 4/1997 | Wilmsmeyer | 438/227 |
| 2007/0042600 | A1* | 2/2007 | Takeoka | 438/638 |
| 2010/0167517 | A1* | 7/2010 | Kirkpatrick et al. | 438/591 |
| 2010/0248463 | A1* | 9/2010 | Letz et al. | 438/585 |
| 2012/0094502 | A1* | 4/2012 | Shin et al. | 438/758 |

* cited by examiner

*Primary Examiner* — Calvin Choi
(74) *Attorney, Agent, or Firm* — Beyer Law Group LLP

(57) ABSTRACT

A method for preventing formation of metal silicide material on a wafer bevel is provided, where the wafer bevel surrounds a central region of the wafer. The wafer is placed in bevel plasma processing chamber. A protective layer is deposited on the wafer bevel. The wafer is removed from the bevel plasma processing chamber. A metal layer is deposited over at least part of the central region of the wafer, wherein part of the metal layer is deposited over the protective layer. Semiconductor devices are formed while preventing metal silicide formation on the wafer bevel.

20 Claims, 5 Drawing Sheets

US 8,603,908 B2

MITIGATION OF SILICIDE FORMATION ON WAFER BEVEL

FIELD OF INVENTION

The present invention relates to the formation of semiconductor devices. More particularly, the present invention relates to the formation of semiconductor devices and the mitigation of silicide formation on a wafer bevel.

BACKGROUND OF THE INVENTION

In the processing of a substrate, e.g., a semiconductor substrate such as one used in the manufacturing of semiconductor devices, plasma is often employed. During substrate processing, the substrate is divided into a plurality of dies on which semiconductor devices are formed. The bevel (periphery or edge) of a wafer substrate is not utilized for forming the dies. During the formation of semiconductor devices metal silicides may be formed on the wafer bevel. The formation of metal silicides on the bevel of the wafer is undesirable.

SUMMARY OF THE INVENTION

To achieve the foregoing and in accordance with the purpose of the present invention a method for preventing formation of metal silicide material on a wafer bevel is provided, where the wafer bevel surrounds a central region. The wafer is placed in a bevel plasma processing chamber. A protective layer is deposited on the wafer bevel. The wafer is removed from the bevel plasma processing chamber. A metal layer is deposited over at least part of the central region of the wafer, wherein part of the metal layer is deposited over the protective layer on the wafer bevel. Semiconductor devices are formed in the central region of the wafer while the protective layer is preventing metal silicide formation on the wafer bevel.

In another manifestation of the invention, a method for preventing formation of silicide material on a wafer bevel is provided, where the wafer bevel surrounds a central region. The wafer is placed in a bevel plasma processing chamber. A protective silicon dioxide layer is deposited on the wafer bevel comprising providing a deposition gas comprising a silane gas and an oxygen gas, forming the deposition gas into a plasma, where the plasma is limited to only the wafer bevel area, and depositing silicon dioxide only on the wafer bevel, where the silane gas provides silicon for the deposited silicon dioxide. The wafer is removed from the bevel plasma processing chamber. A metal layer is deposited over at least part of the central region of the wafer, where part of the metal layer is deposited over the protective silicon dioxide layer. Semiconductor devices are formed in the central region of the wafer while the formation of metal silicide on the wafer bevel is prevented.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
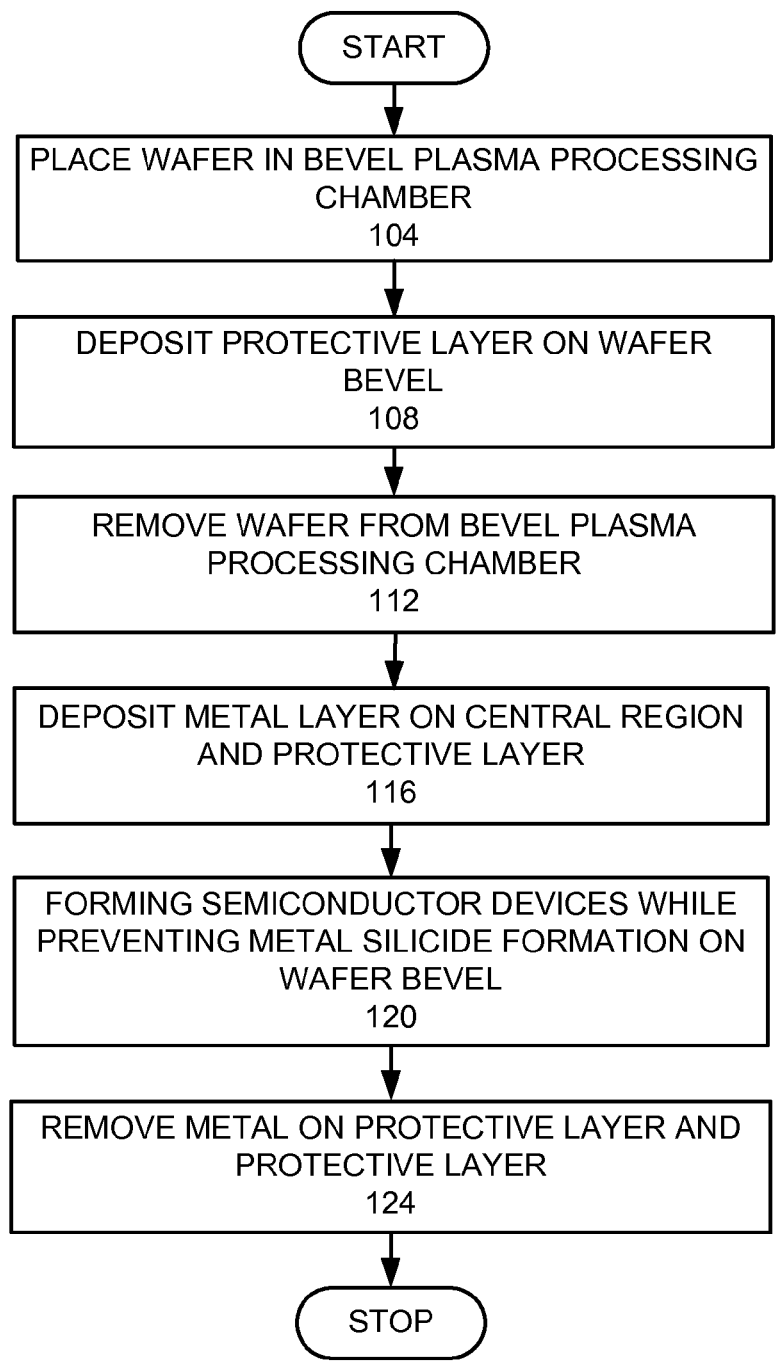
FIG. 1 is a high level flow chart of a process that may be used in an embodiment of the invention.

FIG. 1 is a flow chart of an embodiment of the invention. A wafer is placed in a bevel plasma processing chamber (step 104). A protective layer is deposited on the wafer bevel (step 108). Depositing a layer on the wafer bevel is defined by adding a layer on top of and over the surface of the wafer bevel not forming a layer using material from the surface or below the surface of the wafer bevel. The wafer is removed from the plasma processing chamber (step 112). The wafer is then subjected to one or more semiconductor processing steps, which deposits a metal layer on the central region of the wafer and on the protective layer (step 116) and which would cause the formation of metal silicides where metal is deposited on silicon. However during the formation of the semiconductor devices, the protective layer prevents or suppresses the formation of metal silicides on the wafer bevel (step 120). Normally, several steps are performed, where the formation of the silicide may not be the main objective of these steps, but instead may be an unwanted side effect of several processing steps used for the main objective of forming semiconductor devices. The forming the semiconductor devices does not need to completely form semiconductor devices, but at least performs one or more steps in the formation of semiconductor devices. The metal on the protective layer and the protective layer is removed (step 124) in the bevel plasma processing chamber.

Example Depositing Silicon Dioxide

Figure 2:
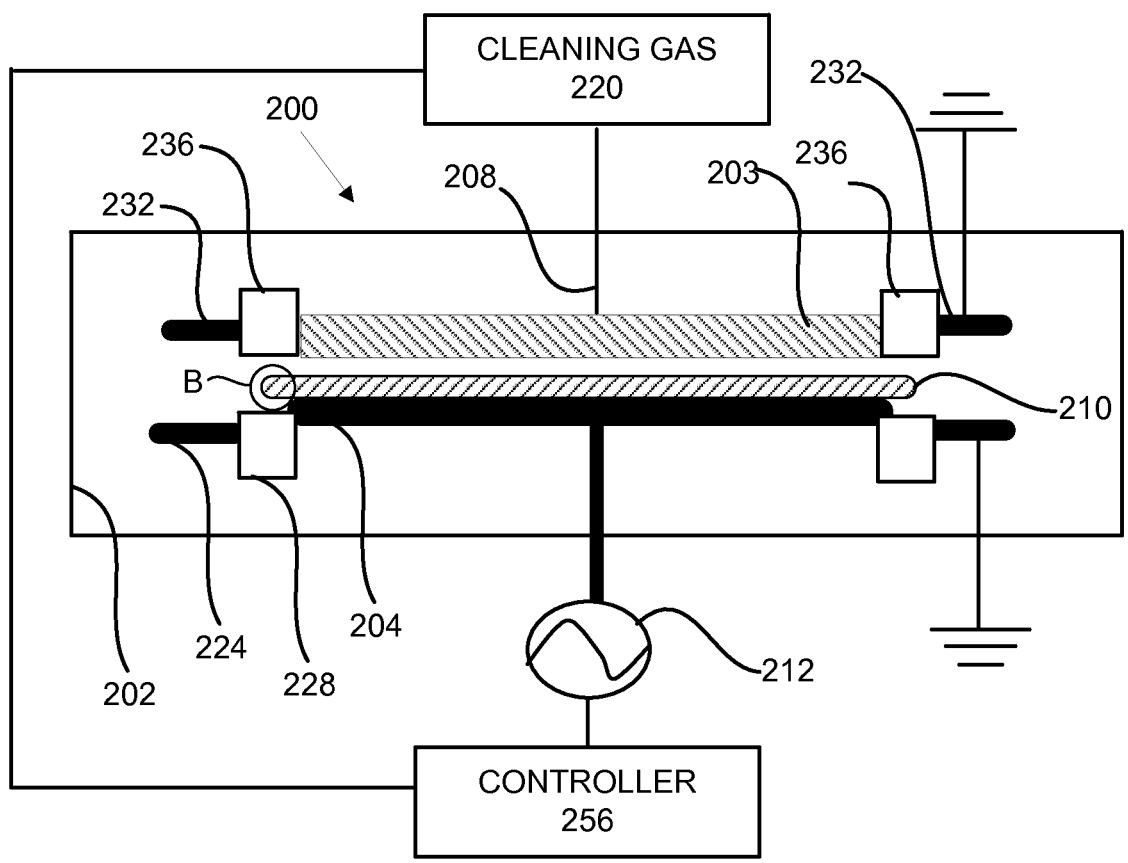
FIG. 2 is a schematic view of a bevel clean processing chamber that may be used in practicing the invention.

To facilitate understanding, a specific example of an embodiment of the invention is provided, where in this example a protective layer of silicon dioxide is deposited over the bevel. A wafer is placed in a bevel plasma processing chamber (step 104). FIG. 2 is a schematic view of a bevel plasma processing chamber 200 that provides an embodiment of the invention. The illustration is not to scale in order to more clearly illustrate various aspects of the plasma processing chamber 200. The bevel of the wafer is the edge of the wafer and part of the top surface of the wafer and bottom surface of the wafer near the edge of the wafer. The bevel plasma processing chamber 200 is enclosed by chamber walls 202. Chamber 200 has a wafer support 204 on which a wafer 210 is placed. In one embodiment, the wafer support 204 is an electrostatic chuck, which is powered by a RF (radio frequency) power source 212 or by multiple RF power sources. The wafer support 204 has a diameter that is less than a diameter of the wafer 210 so that the outer edge of the wafer 210 extends beyond the wafer support 204 around the circumference or perimeter of the wafer 210. In this example, the wafer support is only between 5 and 8 mm smaller than the wafer itself. Spaced apart from the wafer support 204 and a top surface of the wafer 210 is a central cover 203, which acts as a gas distribution plate with a gas inlet 208, which is connected to a gas source 220. Preferably, the central cover 203 is of a dielectric material. In another embodiment of the invention, the central cover is electrically conductive and is grounded. Preferably, the central cover 203 is adjustable, so that during processing the central cover is spaced a distance less than 1 mm from the top surface of the wafer 210 on the wafer support 204. More preferably, the central cover is spaced a distance of less than 0.75 mm from the top surface of the wafer 210. Most preferably, the central cover 203 is spaced between 0.3 mm to 0.4 mm from the top surface of the wafer 210. A first conductive ring 224 surrounds the wafer support 204. The first conductive ring 224 is of a conductive material. An insulator ring 228 is placed between the first conductive ring 224 to space apart and insulate the first conductive ring 224 from the wafer support 204. A second conductive ring 232 surrounds the central cover 203. The second conductive ring 232 is of a conductive material. An insulator ring 236 is placed between the second conductive ring 232 and the central cover 203 to space apart the second conductive ring 232 from the central cover 203. The outer diameter of insulator ring 236 can be either smaller or larger or as big as the wafer itself. A specific diameter is chosen to control the exact inward limit of the deposition of the protective layer on the upper half of the wafer bevel. Similarly, the outer diameter of insulator ring 228 can be either smaller or larger or as big as the wafer itself. A specific diameter is chosen to control the exact limit of the deposition of the protective layer on the lower half of the wafer bevel.

Figure 3:
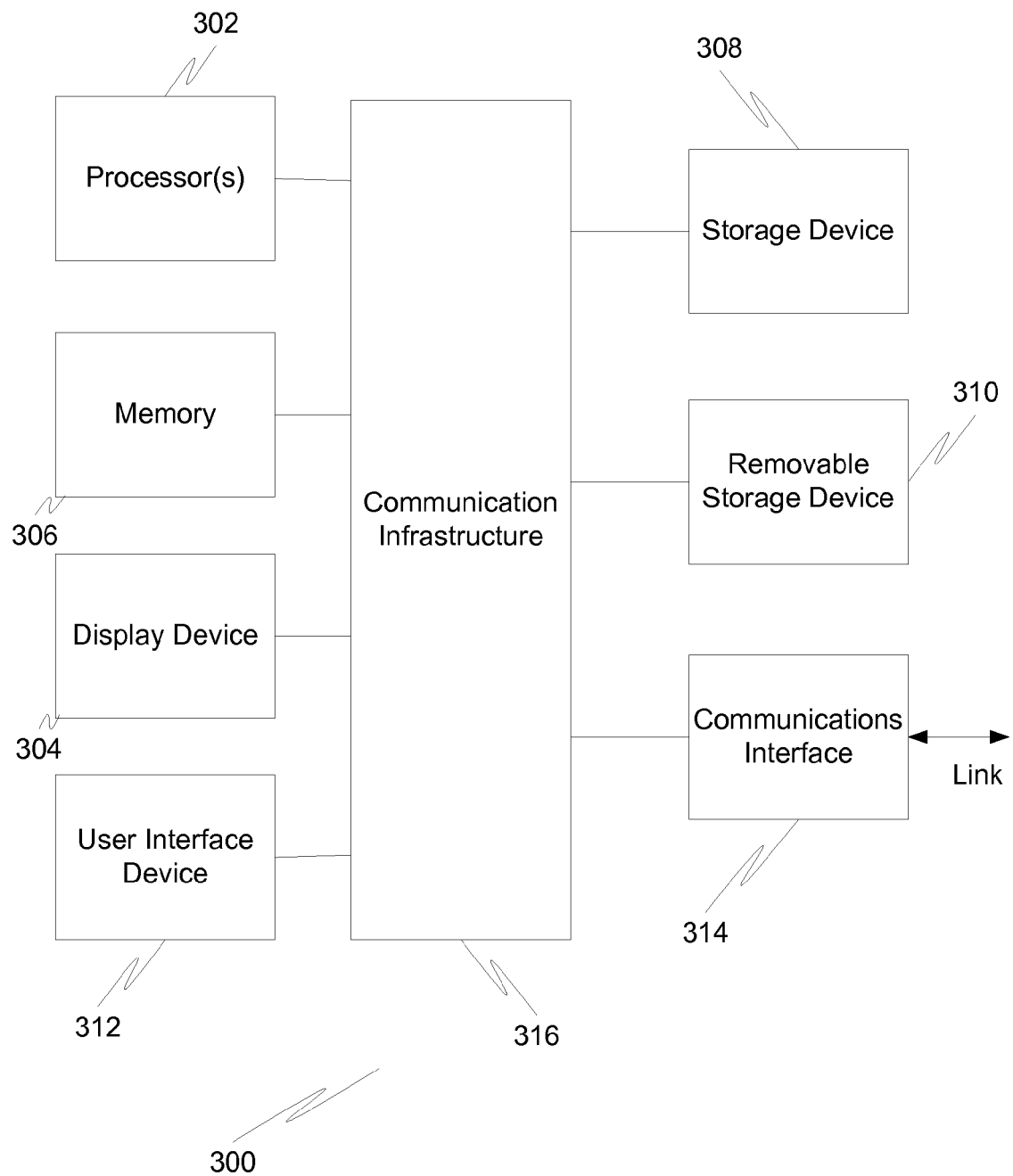
FIG. 3 illustrates a computer system, which is suitable for implementing a controller used in embodiments of the present invention.

FIG. 3 is a high level block diagram showing a computer system 300, which is suitable for implementing a controller 256 used in embodiments of the present invention. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4:
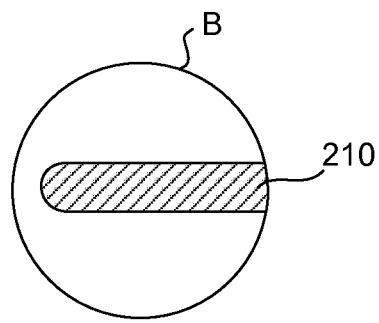
FIG. 4 is an enlarged view of section B of FIG. 2.
Figure 5:
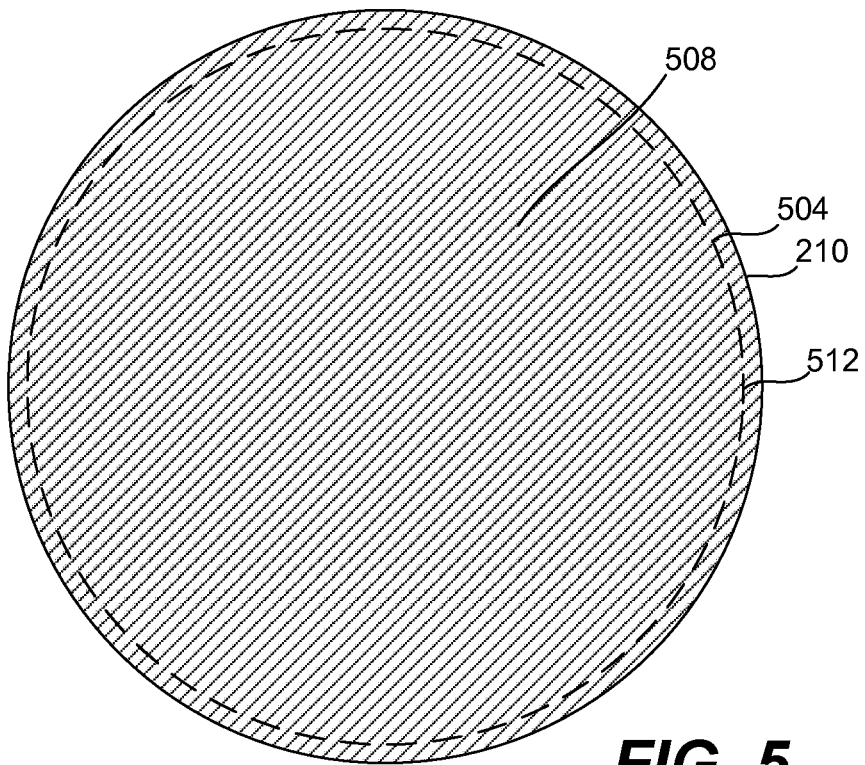
FIG. 5 is a top view of a wafer.

FIG. 4 is an enlarged view of section B of FIG. 2, showing the bevel of the wafer 210. FIG. 5 is a top view of the wafer 210. The wafer 210 is divided into a bevel region 504 and a central region 508, where a border 512 is drawn for clarification, but the wafer might not actually have a marked border. The border is typically less than 0.5 mm from the apex of the wafer. However, the size of the wafer and the bevel region are not drawn to scale, so that the bevel region may be seen more clearly.

Figure 6:
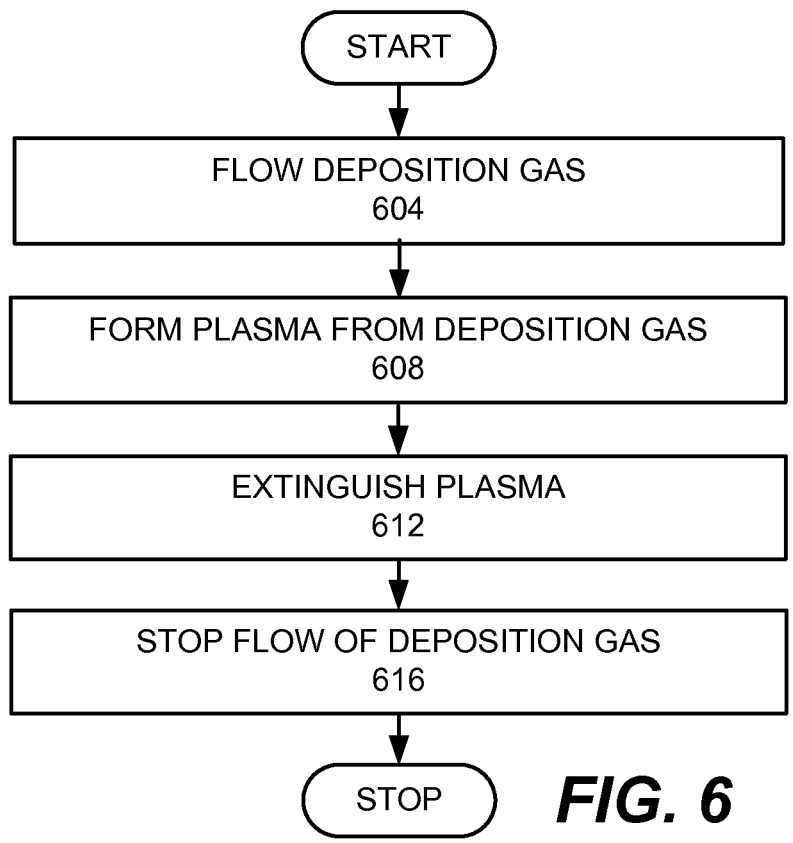
FIG. 6 is a more detailed flow chart of a step of depositing a protective layer on the wafer bevel.

A protective layer is deposited on the wafer bevel (step 108). FIG. 6 is a more detailed flow chart of the step of depositing a protective layer. A deposition gas is flowed into the bevel plasma processing chamber (step 604). A plasma is formed from the deposition gas (step 608). The plasma is extinguished (step 612). The flow of the deposition gas is stopped (step 616). For depositing a silicon dioxide layer over the surface of the bevel of a wafer, the deposition gas comprises a silicon containing gas, such as silane, and oxygen. An example of a recipe for doing this provides a deposition gas of 100 sccm $SiH_4$ (silane) and 200 sccm $O_2$ (oxygen), where a pressure of 2 Torr is maintained. The deposition gas is formed into a plasma by providing 600 Watts of RF power at a frequency of 13 MHz. Preferably, the protective layer has a thickness of at least 10 nm. More preferably, the protective layer has a thickness of at least 75 nm. More preferably, the protective layer has a thickness of at least 100 nm. Preferably, the deposition is performed at a wafer temperature of less than 120° C. More preferably, the deposition is performed at a wafer temperature of less than 75° C. Preferably, the deposition gas comprises silane and oxygen. More preferably, the deposition gas consists essentially of silane and oxygen. More preferably, the deposition gas has at least twice the molar flow of oxygen than silane.

Figure 7:
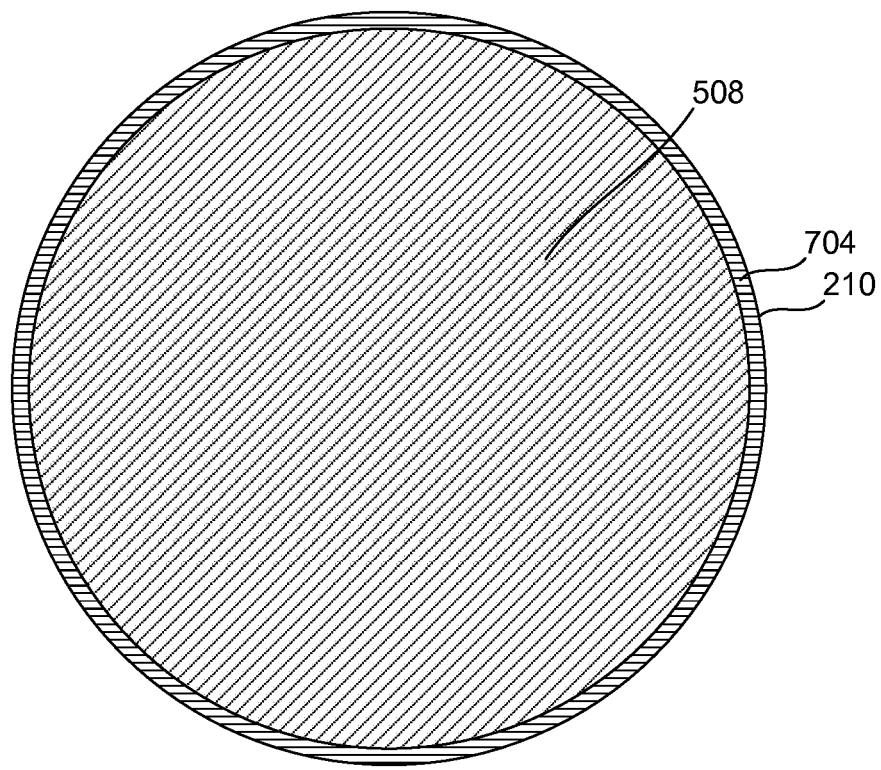
FIG. 7 is a top view of the wafer after the protective layer is formed over the surface of the wafer bevel.
Figure 8:
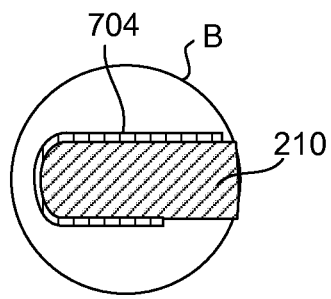
FIG. 8 is an enlarged view of section B after the protective layer is formed over the surface of the wafer bevel.

FIG. 7 is a top view of the wafer 210 after the protective layer 704 is formed over the surface of the wafer bevel. FIG. 8 is an enlarged view of section B after the protective layer 704 is formed over the surface of the wafer bevel. The protective layer 704 may have the same diameter over the back side and front side of the wafer, or may have different diameters over the back side and front side of the wafer, as shown in FIG. 8.

It should be noted that as defined above, depositing a layer on the wafer bevel is defined by adding a layer on top of and over the surface of the wafer bevel not forming a layer using material from the surface or below the surface of the wafer bevel. Therefore, the protective layer 704 is deposited over the original surface of the wafer bevel 210, as shown. This is in contrast to a layer described in US Patent Application Publication No. 2010/024863 to Letz et al., which was published on Sep. 30, 2010, where a silicon dioxide is formed in or under the original surface of the wafer bevel. The process of Letz et al. uses the silicon of the wafer bevel to form silicon dioxide "in a surface area" by oxidizing the silicon of the wafer bevel. Such a process has been found to be too slow. In contrast, our invention uses silicon from the silane gas to add silicon dioxide on top of the silicon wafer that is formed into silicon dioxide, which provides a sufficiently fast process. The speed or growth rate of this deposition can be more easily controlled by process parameters such as RF power, process pressure, pre-cursor flow rate ($SiH_4$ and $O_2$) and wafer temperature.

The wafer 210 is removed from the bevel plasma processing chamber (step 112). The wafer is removed so that the central region 508 of the wafer may be processed to form semiconductor devices. Before providing the protective layer 704, semiconductor devices may be partially formed in the central region 508 or the protective layer 704 may be formed before the semiconductor devices are formed.

A hardening step may be provided to harden and/or increase the density of the silicon dioxide protective layer. Such a hardening step may be performed by a special treatment of the wafer bevel such as UV light exposure or by heating the wafer bevel or the entire wafer. The hardening step may be performed before or after the wafer is removed from the bevel plasma processing chamber.

During the formation of the semiconductor devices, a metal layer is deposited on the central region and the protective layer (step 116). In a preferred embodiment, the metal is nickel. Nickel is the material of choice for high-k gate electrodes. To create such electrodes, several semiconductor device formation steps are performed on the wafer. In addition, one or more other semiconductor device formation steps may be used, which may be various combinations of masking, deposition, and etching steps. During one or more of these steps if metal is in direct contact with the silicon wafer metal silicide may be formed from parts of the metal layer and the silicon wafer. The formation of metal silicide may be an unwanted side effect of the device formation process. If nickel is in direct contact with the silicon wafer the nickel and silicon form a nickel silicide. The protective silicon dioxide layer prevents metal deposited over the protective layer from becoming a metal silicide during a combination of manufacturing steps for forming semiconductor devices, since this protective silicon dioxide layer serves as a physical barrier that prevents nickel from making physical contact with the silicon surface of the wafer (step 120).

The metal layer on the protective layer and the protective layer are removed (step 124). The removal of the metal layer and protective layer may be performed in one or more steps. A wet etch or a chemical-mechanical polish may be able to remove both, the metal layer and the protective layer in a single step as does a dry etch process. If the removal is performed in two steps, then the metal layer would be removed before the protective layer. The first step to remove the metal layer may be a wet or dry etch. The second step to remove the protective layer may be a wet or dry process. If a dry etch is performed, the bevel plasma processing chamber used for the dry etch may be the same bevel plasma processing chamber as previously used for depositing the protective layer or may be a different bevel plasma processing chamber. In this embodiment, the bevel plasma processing chamber has the same features as described regarding the bevel plasma processing chamber above. To remove a nickel metal layer a corrosive chemistry, such as chlorine would be used (corrosives may be used but are not necessary). Subsequent steps may be performed to further complete the semiconductor devices or add additional semiconductor devices.

Providing a protective layer on the surface of the wafer bevel prevents formation of metal silicides on the surface of the wafer bevel. This allows the metal to be more easily removed, which prevents contamination and particle issues further down the line.

The formation of the silicon dioxide protective layer from the gas phase using silane allows for a quicker formation of a protective layer. Such a layer may be more fragile and less dense than a protective layer formed by other processes. However, it is believed that such a protective layer is sufficiently strong and dense to provide the desired protection or may be made sufficiently strong and dense with a hardening step.

Example Depositing a Polymer

In other embodiments, the protective layer is formed from a polymer material. The same steps as practiced above may be used, but the protective layer is formed by depositing a polymer. Therefore, referring to FIG. 1, a wafer is placed in a bevel plasma processing chamber (step 104).

A protective layer is deposited on the wafer bevel (step 108). In this embodiment, the protective layer is a polymer layer. In this embodiment, the depositing of the polymer layer comprises providing a polymer deposition gas. Generally, a polymer deposition gas would be a gas with a carbon containing component and a hydrogen containing component. In some embodiments, the polymer deposition gas would further contain a fluorine containing component. The different components may be from the same molecule. For example, $CH_3F$ is both the carbon containing component, hydrogen containing component, and fluorine containing component. Other polymer forming gases may comprise $C_4F_8$, $CHF_3$, and $CH_2F_2$. As with the silicone dioxide protective layer, the polymer protective layer needs to provide a diffusion barrier for the nickel such that it cannot react with the underlying silicon. Therefore the polymer must have a certain thickness, density, and etch resilience to withstand post deposition processing. A sample recipe for forming the polymer layer would provide a deposition gas of 300 sccm $C_4H_6$ at a pressure of 2 Torr and a wafer temperature of less than 50° C. To form the deposition gas into a plasma an RF power of 600 Watts at 13 MHz is provided.

A polymer hardening step may be provided to make the polymer more resistant to post deposition processing. Such a hardening step may use UV hardening or other polymer hardening processes.

The wafer is removed from the plasma processing chamber (step 112). A metal layer is deposited on the central region of the wafer and on the protective layer (step 116). One or more semiconductor device formation steps are performed on the wafer. The semiconductor device formation steps may be various combinations of masking, deposition, and etching steps. During one or more of these steps, if metal is in direct contact with the silicon wafer, metal silicide may be formed from parts of the metal layer and the silicon wafer. The formation of metal silicide may be an unwanted side effect of the device formation process. The protective polymer layer prevents metal deposited over the protective layer from becoming a metal silicide during a combination of manufacturing steps during the formation of semiconductor devices, since this protective polymer layer serves as a physical barrier that prevents metal from making physical contact with the silicon surface of the wafer bevel (step 120).

The metal on the protective layer and the protective layer are removed (step 124). As mentioned above this may be performed in a single step, such as by providing a wet etch or a chemical-mechanical polish or a dry etch or it may be done in two or more steps.

The polymer would be easier to remove than other protective layers. Easier removal of the protective layer may make the protective polymer layer more desirable; however, a too fragile protective layer is undesirable. Therefore, a hardening step may be used to harden the protective polymer layer. Generally, polymer layer, being an organic film, is usually less durable than a silicon dioxide layer which is inorganic.

The use of a bevel plasma processing chamber for providing the protective layer, allows the protective layer to be formed only on the wafer bevel and not on the central region of the wafer. The close placement of the dielectric cover and the insulator ring to the surface of the wafer prevents plasma from forming above the central region, which prevents deposition on the central region.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for preventing formation of metal silicide material on a wafer bevel, wherein the wafer bevel surrounds a central region, the method comprising:
    placing the wafer in bevel plasma processing chamber;
    depositing a protective layer on the wafer bevel;
    removing the wafer from the bevel plasma processing chamber;
    depositing a metal layer over at least part of the central region of the wafer, wherein part of the metal layer is deposited over the protective layer; and
    forming semiconductor devices while preventing metal silicide formation on the wafer bevel.

2. The method, as recited in claim 1, further comprising placing a central dielectric cover forming part of the bevel plasma processing chamber a distance of no more than 0.75 mm from an upper surface of the wafer.

3. The method, as recited in claim 2, wherein the protective layer has a thickness of at least 10 nm.

4. The method, as recited in claim 3, wherein the depositing the protective layer on the wafer bevel is performed at a temperature of less than 120° C.

5. The method, as recited in claim 4, wherein the depositing the metal layer over at least part of the central region of the wafer deposits a nickel layer.

6. The method, as recited in claim 2, wherein the depositing the protective layer on the wafer bevel comprises:
    providing a deposition gas comprising a silane gas and an oxygen gas;
    forming the deposition gas into a plasma, wherein the plasma is limited to only the wafer bevel area;
    depositing silicon dioxide only on the wafer bevel, wherein the silane gas provides silicon for the deposited silicon dioxide.

7. The method, as recited in claim 6, further comprising hardening the deposited silicon dioxide.

8. The method, as recited in claim 7, wherein the hardening comprises heat or UV treating the deposited silicon dioxide.

9. The method, as recited in claim 7, further comprising removing the metal layer on the protective layer and the protective layer.

10. The method, as recited in claim 6, wherein the depositing the protective layer only deposits the protective layer on the surface of the wafer bevel and not on the central region of the wafer.

11. The method, as recited in claim 2, wherein the depositing the protective layer on the wafer bevel comprises:
    providing a deposition gas comprising a polymer forming gas;
    forming the deposition gas into a plasma, wherein the plasma is limited to only the wafer bevel area;
    depositing polymer only on the wafer bevel.

12. The method, as recited in claim 1, wherein the depositing the protective layer only deposits the protective layer on the surface of the wafer bevel and not on the central region of the wafer.

13. The method, as recited in claim 1, further comprising removing the metal layer on the protective layer and the protective layer.

14. The method, as recited in claim 1, wherein the depositing the protective layer on the wafer bevel comprises:
    providing a deposition gas comprising a silane gas and an oxygen gas;
    forming the deposition gas into a plasma, wherein the plasma is limited to only the wafer bevel area;
    depositing silicon dioxide only on the wafer bevel, wherein the silane gas provides silicon for the deposited silicon dioxide.

15. The method, as recited in claim 1, wherein outer diameters of insulator rings control an inner boundary of the deposited protective layer.

16. A method for preventing formation of silicide material on a wafer bevel, wherein the wafer bevel surrounds a central region, the method comprising:
    placing the wafer in a bevel plasma processing chamber;
    depositing a protective silicon dioxide layer on the wafer bevel comprising;
        providing a deposition gas comprising a silane gas and an oxygen gas;
        forming the deposition gas into a plasma, wherein the plasma is limited to only the wafer bevel area; and
        depositing silicon dioxide only on the wafer bevel, wherein the silane gas provides silicon for the deposited silicon dioxide;
    removing the wafer from the bevel plasma processing chamber;
    depositing a metal layer over at least part of the central region of the wafer, wherein part of the metal layer is deposited over the protective silicon dioxide layer; and
    forming semiconductor devices while preventing metal silicide formation on the wafer bevel.

17. The method, as recited in claim 16, further comprising removing the metal layer on the protective layer and the protective layer.

18. The method, as recited in claim 17, further comprising hardening the deposited silicon dioxide.

19. The method, as recited in claim 18, wherein the hardening comprises heat or UV treating the deposited silicon dioxide.

20. The method, as recited in claim 16, wherein outer diameters of insulator rings control an inner boundary of the deposited protective silicon dioxide layer.

* * * * *